United States Patent [19]

Fraser et al.

[11] 4,337,476
[45] Jun. 29, 1982

[54] SILICON RICH REFRACTORY SILICIDES AS GATE METAL

[75] Inventors: David B. Fraser, Berkeley Heights; Shyam P. Murarka, New Providenc, both of N.J.

[73] Assignee: Bell Telephone Laboratories, Incorporated, Murray Hill, N.J.

[21] Appl. No.: 178,989

[22] Filed: Aug. 18, 1980

[51] Int. Cl.³ .................................... H01L 23/48
[52] U.S. Cl. ............................ 357/67; 357/23; 427/93; 428/446; 428/472
[58] Field of Search ............. 428/472, 446; 427/93; 204/192 S; 357/67, 23, 59, 71

[56] References Cited

U.S. PATENT DOCUMENTS

| 4,128,670 | 12/1978 | Gaensslen | 427/86 |
| 4,180,596 | 12/1979 | Crowder | 422/42 |
| 4,276,557 | 6/1981 | Levinstein | 357/67 |
| 4,285,761 | 8/1981 | Fatula | 427/93 |

OTHER PUBLICATIONS

"Ohmic Contacts to Silicon", *The Electrochemical Society, Inc.*, p. 166, 1969.
"Oxidation of Sputtered Molybdenum Silicide Thin Films", *Applied Physics*, Nov. 11, 1978, pp. 826, 827.

*Primary Examiner*—Ellis P. Robinson
*Attorney, Agent, or Firm*—Herbert M. Shapiro

[57] ABSTRACT

Silicon-rich silicides of titanium and tantalum have been found to be suitable for use as the gate metal in semiconductor integrated circuits replacing polysilicon altogether. Such silicon-rich silicides, formed by sintering a cosputtered alloy with silicon to metal ratio of three as in deposited film, are stable even on gate oxide. The use of these compounds leads to stable, low resistivity gates and eliminates the need for the high resistivity polysilicon gate.

7 Claims, 4 Drawing Figures

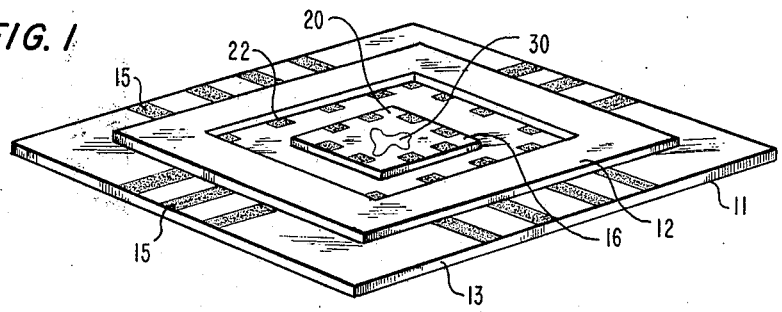
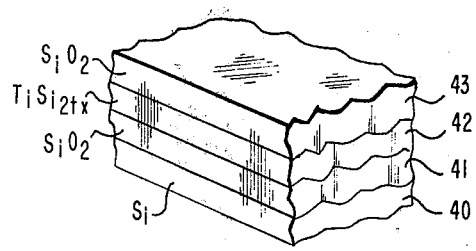
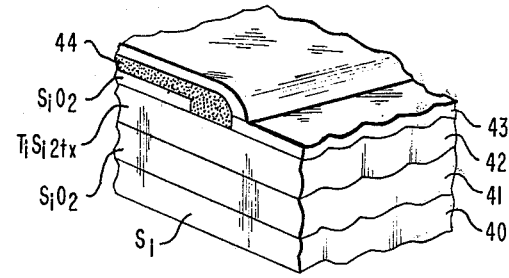
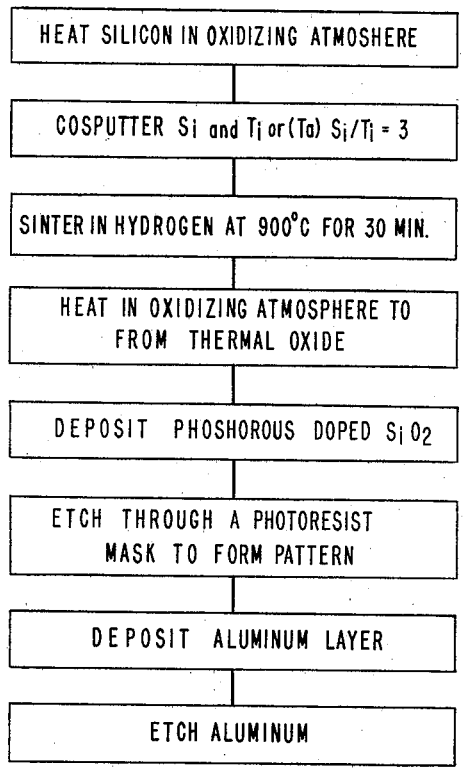

SILICON RICH REFRACTORY SILICIDES AS GATE METAL

FIELD OF THE INVENTION

This invention relates to semiconductor integrated circuits.

BACKGROUND OF THE INVENTION

Semiconductor integrated circuits, as well as the design, manufacture, and operation of such circuits, are well known in the art. Common to such circuits is an epitaxially grown single crystal film in which various regions of different conductivity type are interconnected by multiple layers of patterned electrically conducting material.

A variety of electrically conducting material is available for implementing the layers. Gold, copper, aluminum, Polycrystalline Silicon (or "polysilicon"), and various metal alloys, for example, are all suitable to some extent. On the other hand, each has its drawbacks as is well known in the art.

In large scale integration (LSI)-metal-oxide-semiconductor (MOS)-field effect transistor (FET) technology, polysilicon has become the standard material for the conducting layer closest to the epitaxial film. Typically, the polysilicon layer is a first layer separated from a second electrically conducting overlay by an insulating layer typically of silicon dioxide.

Polysilicon exhibits relatively high resistivity and the lengths of polysilicon paths are limited as a consequence. For example, various functional areas in an integrated circuit chip cannot be interconnected together directly by polysilicon. Rather, the connections from each area are brought out to aluminum bus bars formed from the second overlay. Similarly, LSI high speed circuits require high conductivity input-output lines. The requirement results in the exclusion of polysilicon as a material for such use. Aluminum power lines are needed and this often requires aluminum bonding pads within the chip. The additional aluminum areas, are, essentially, wasted space and parallel aluminum conductors yield problems.

Copending application Ser. No. 974,378 for Levinstein, Murarka, and Sinha, filed Dec. 29, 1978 discloses the high conductivities of silicides used with a thin layer of polysilicon. The method for fabrication described therein involved depositing a layer of Ti or Ta on a polysilicon layer. The resulting structure was then sintered at about 900 degrees C. to form $TiSi_2$ or $TaSi_2$. The excess silicon from the polysilicon layer allowed a later oxidation to $SiO_2$.

In order to improve resolution of patterns in layers of material on chips with increasingly higher packing densities, and therefore, increasingly narrower apertures, it is advantageous to reduce the thickness of the layers as well. One route to this goal would be the elimination of the high-resistance polysilicon layer completely. However, in the above-mentioned application of Levinstein, Murarka and Sinha, it is stated that the polysilicon layer is necessary as a source of silicon for the reduction of the metal to silicide and for the subsequent oxidation to form $SiO_2$. It is also stated that in the absence of the polysilicon, the silicide forming layer will react with the underlying gate oxide to form an undesirable oxide overlay which cannot be etched. A problem thus exists as to the realization of increasingly thinner layers in which patterns are formed for realizing increasingly higher packing density devices.

BRIEF DESCRIPTION OF THE INVENTION

The solution to the above problem was found through studies of the silicides used on a polysilicon layer as a gate metal. It was found that silicon-rich silicide, formed by sintering a cosputtered alloy with silicon to metal (Ti or Ta) atomic ratio of three in the as-deposited film, is stable even on the gate oxide and in oxidizing mediums. In addition, the resistivity and stress of Si-Ti alloys is a minimum for Si/Ti ratio nominally equal to three. Such a silicon-rich silicide can be used even without the polysilicon layer and leads to a stable, low resistivity gate.

Thus, the invention comprises a semiconductor integrated circuit including a single crystal semiconductor layer coated by an $SiO_2$ layer and including a lamellate overlay comprising first and second electrically conducting layers separated by an electrically insulating layer. The structure is characterized in that the overlay includes a layer of silicon-rich silicide deposited directly on the gate oxide without a layer of polysilicon as a buffer between the gate oxide and the silicide layer. The excess silicon, present as interstitials within the lattice of the silicide, replaces the polysilicon layer as a source of silicon for oxidation to $SiO_2$.

BRIEF DESCRIPTION OF THE DRAWING

FIG. 1 is a projection view of a semiconductor integrated circuit chip assembly;

FIGS. 2 and 3 are cross sectional views of portions of the chip shown in FIG. 1; and FIG. 4 is a block diagram of a process for making the chip of FIG. 1.

DETAILED DESCRIPTION

FIG. 1 shows a projection view of a semiconductor chip assembly. The assembly includes a substrate 11. The substrate comprises layers 12 and 13 sandwiching a sunburst pattern 15 of electrical conductors therebetween. Layer 12 includes a centrally disposed square aperture 16 which exposes the inner ends of the conductors of the sunburst pattern.

A semiconductor integrated circuit chip 20 is mounted on the portion of layer 13 exposed by aperture 16. Typically, chip 20 includes electrical lands 22 at its periphery for external connection to the exposed inner ends of the electrical conductors of the sunburst.

An integrated circuit chip has multiple functional areas defined therein. These areas are interconnected with one another and to lands 22 by conductors defined by patterned layers of electrically conducting material formed on the surfaces of chip 20. These layers are electrically insulated from one another and from the epitaxial layer of the chip typically by silicon dioxide layers.

Of course, contact between portions of the conducting layers and various regions of opposite conductivity in the epitaxial layer require through connections. The term "through connection" herein refers to an electrically conducting path from one layer of conducting material to another as to the epitaxial layer through other layers separating the layers from one another. When through connections are made, electrical continuity is achieved between the areas of the chip and the externally exposed ends of the conductors of the sunburst pattern. The design permits external connection even with a closure member (not shown) over opening 16 secured in place.

Freeform area 30 of FIG. 1 is a representative area of chip 20 and it is to this area that we now turn our attention. FIGS. 2 and 3 show area 30 partially in cross section to expose the plurality of layers from which the chip is constituted. The bottom layer 40 as shown, illustratively, comprises silicon on which an electrically insulating layer 41 of silicon dioxide is formed typically by growing the layer by heating in an oxidizing atmosphere. This step is represented by the top block in FIG. 4. Layer 40 comprises an epitaxially grown layer 10–20 microns thick. In accordance with this invention, the layer 41 is 1000 Angstroms or thinner.

The next layer 42 comprises a silicon-rich silicide, typically of titanium or tantalum. In, for example, the case of titanium, silicon-rich titanium silicide is cosputtered on the gate oxide film. The cosputtering step is indicated by the second block in FIG. 4. The nominal silicon to titanium ratio, controlled by independently controlling the deposition rates of Si and Ti from two independent targets, is Si/Ti=3. Typically, a 2500 Angstrom silicide film is deposited. The alloy is then sintered in hydrogen at 900 degrees C. for 30 minutes as indicated by the third block in FIG. 4.

The silicide film that results has a sheet resistance of less than $1\Omega/[\ ]$. The compound formed can be thought of as $TiSi_{2+x}$. Experiments in which silicon and titanium were cosputtered in different ratios show that for Si/Ti greater than two, $TiSi_2$ is the only compound formed. It is thought that the excess silicon is present in the $TiSi_2$ lattice as interstitials. For a film with an as desposited Si/Ti ratio of 3, Rutherford backscattering composition for the sintered alloy is $TiSi_{2.5}$. This would means four excess silicon atoms per unit cell of $TiSi_2$. The fact that this composition shows the lowest stress and resistivity indicates a range of solid solubility of Si in $TiSi_2$. The compressive stress due to the excess silicon reduces the tensile stress produced by the volume change during silicide formation. With alloys cosputtered on oxide, for Si/Ti<2, no silicide is formed, and resistivity is high. For Si/Ti>3, the silicon concentration is higher than that required for $TiSi_{2.5}$, and resistivity increases with increasing silicon concentration.

A layer of self-passivating thermal oxide is formed over the $TiSi_{2+x}$ layer by heating in an oxidizing atmosphere as indicated by the fourth block in FIG. 4. A field oxide of phosphorous-doped $SiO_2$ is then deposited and patterned by plasma etching as indicated by the fifth and sixth block of FIG. 4. Following patterning of this $SiO_2$ layer 43, a layer 44 of Al, 0.5 percent Cu, from 7000 Angstroms-1, micron thick is deposited by sputtering. The aluminum layer is etched in a plasma of $CCl_4$, $BCl_3$ and He. The aluminum deposition and etching steps are represented by the last two blocks in FIG. 4.

The following is a specific example of an IGFET fabricated with the above-described silicon-rich silicide system.

The starting material is a substrate of single crystal Si, having a (100) orientation and doped with boron to a resistivity of 7 ohm cm. The Si-substrate is thermally oxidized at 1000 degrees C. for 30 minutes in a dry oxygen ambient to grow an oxide 350 Angstroms thick. Over this oxide, a thin film of $Si_3N_4$ is deposited by chemical vapor deposition from a mixture of silane and ammonia at 680 degrees C. A layer of photoresist is defined into a pattern using standard photolithographic techniques so as to leave the resist over active device areas of the wafer. The $Si_3N_4$ is etched from the nonactive "field" areas thus defined, using an rf-glow discharge in a mixture of $CF_4$ and $O_2$. The etched areas are implanted with boron ions accelerated to a voltage of 30 kV and up to a total dose of $1.5 \times 10^{13}$ ions/cm². This step leads to the formation of a heavily p-doped channel stop with a high threshold voltage in the nonactive field areas. The resist is then stripped in an oxygen plasma and the exposed areas of thin oxide in the field region are etched in a solution of buffered HF down to bare Si. With the active areas masked by the $Si_3N_4$ film, the wafer is subjected to a mixture of 10 percent $O_2$+90 percent $N_2$ at 1100 degrees C. for 20 minutes to drive in the implanted B ions and then to a steam ambient at 1000 degrees C. for 430 minutes to form a field oxide, 10,000 Angstroms thick. The masked areas are cleaned by successively etching in buffered HF, hot $H_3PO_4$ (180 degrees C.) and buffered HF down to Si in the active gate area. Gate oxide of less than 1000 Angstroms is grown at 1000 degrees C. in a mixture of $O_2$+3 percent HCl for 42 minutes. The oxide is annealed, in situ, for one-half hour in Ar also at 1000 degrees C. to provide optimum electrical characteristics of the $Si/SiO_2$ interface. In order to adjust the threshold voltage of the MOSFETs, the Si in the gate areas is implanted with B at 3 Kev to a dose of $5 \times 10^{11}$ cm$^{-2}$.

A layer of silicon-rich titanium silicide, 2500 Angstroms thick, is deposited by cosputtering on the gate oxide with a silicon to titanium atomic ratio of three. The alloy is then sintered in hydrogen at 900 degrees C. for 30 minutes. The sheet resistance of the resulting silicide film is less than 1 ohm per square cm.

A desired pattern of a masking layer consisting of photoresist is formed over the $TiSi_{2+x}$ by using standard lithographic techniques. The silicide layer is etched in a plasma of $CF_4$+8 percent $O_2$ at a pressure of 150 millitorr and at a power of 200 watts and at a temperature greater than 70 degrees C. The resist is removed and the wafer is cleaned.

Source and drain areas of the MOSFETs are formed by ion-implanting arsenic at 30 Kv and a dose of $7 \times 10^{15}$ cm$^{-2}$ through the thin oxide layers. The previously defined areas of $TiSi_{2+x}$ and thick oxide in the field region act as a mask against arsenic implantation. A thin layer of oxide is grown over the silicide areas in steam at 1000 degrees C. for 10 minutes. The top of the wafer is coated with photoresist and $SiO_2$ is etched off the back of the wafer in a buffered HF solution.

A 1$\mu$ thick layer of phosphorous doped $SiO_2$ (7 percent P-glass) is deposited using a reaction of $SiH_4$, $O_2$ and $PH_3$ at 480 degrees C. This oxide is flowed at 1100 degrees C. for 15 minutes in nitrogen to achieve a smooth topology. The wafers are gettered at 1000 degrees C. in $PBr_3$ for 30 minutes to help remove unwanted heavy metal impurities from the active surface regions of the wafer to the back of the wafer. Windows (apertures) are opened in the P-glass down to diffused Si in the source and drain areas and to the $TiSi_{2+x}$ gate. The wafers are annealed at 700 degrees C. in $H_2$ for 30 minutes to reduce slow-trapping instability in the gate oxide.

A top metallization layer of Al, 0.5 percent Cu, 7000 Angstroms thick, is deposited using a sputter gun. Using standard techniques, the metal is patterned and etched to form contacts, interconnections, and bonding pads. The top of the wafer is coated with photoresist and then the phosphorous-doped Si-layer, which formed on the back of the wafer during gettering, is removed by plasma etching in $CF_4 + 8$ percent $O_2$ at 50 watts for 20 minutes. Subsequently, the resist is stripped in an $O_2$ plasma at 100 watts for 10 minutes. The wafers are annealed in $H_2$ at 450 degrees C. for one-half hour to assure ohmic contacts and to anneal out surface states in the gate oxide. A passivation layer of $1\mu$ thick Si-N is deposited by plasma enhanced chemical vapor deposition from a mixture of $SiH_4$, $NH_3$ and Ar at 300 degrees C. Bonding pad areas are opened by etching Si-N in a $CF_4/O_2$ plasma.

The back of the wafer is cleaned and a film of Ti followed by Au is deposited by sequential evaporation. The devices are tested, separated into chips and packaged by bonding the back of the chip to a metallized mini ceramic with an Au, Si eutectic alloy, and by bonding Au-wires to the Al bonding pads and to metallized interconnections on the package leading to dual-in-line pins. The hermetic packaging is completed by soldering a closure member (not shown in FIGS.) in a dry $N_2$ ambient.

What is claimed is:

1. An arrangement including a semiconductor chip comprising a single crystal semiconductor layer, a first electrically-insulating $SiO_2$ layer overlying said semiconductor layer, a first layer of electrically-conducting material overlying said $SiO_2$ layer, said electrically-conducting material comprising a silicon-rich silicide taken from a group of metals comprising titanium and tantalium and having an atomic ratio of the silicon to metal in the as-deposited film equal to or greater than 2 and less than or equal to 3, and a second layer of $SiO_2$ overlying said first layer.

2. An arrangement in accordance with claim 1 wherein said semiconductor layer comprises an epitaxially grown layer of silicon.

3. An arrangement in accordance with claim 2 wherein said second electrically-insulating $SiO_2$ layer overlying said first layer of electrically-conducting material has a pattern of apertures therein.

4. An arrangement in accordance with claim 3 wherein said chip also comprises a second layer of electrically-conducting material overlying said patterned second layer of $SiO_2$ and forming through connections to said first layer of electrically-conducting material.

5. An arrangement in accordance with claim 4 wherein said second layer of electrically-conducting material comprises aluminum.

6. An arrangement in accordance with claim 2 wherein said silicon-rich silicide is formed by sintering in hydrogen at a temperature not less than 800 degrees C.

7. An arrangement in accordance with claim 6 wherein said silicon and metal are cosputtered in an atomic ratio of silicon/metal equal to three.

* * * * *